US012677441B2

(12) United States Patent
Yasutake et al.

(10) Patent No.: US 12,677,441 B2
(45) Date of Patent: Jul. 7, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takuya Yasutake, Kanazawa Ishikawa (JP); Hiroaki Katou, Nonoichi Ishikawa (JP); Hirofumi Kawai, Nonoichi Ishikawa (JP); Hiroyuki Kishimoto, Nonoichi Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 679 days.

(21) Appl. No.: 17/856,294

(22) Filed: Jul. 1, 2022

(65) Prior Publication Data

US 2023/0261105 A1 Aug. 17, 2023

(30) Foreign Application Priority Data

Feb. 14, 2022 (JP) ................................. 2022-020517

(51) Int. Cl.
H10D 30/01 (2025.01)
H10D 30/66 (2025.01)
(Continued)

(52) U.S. Cl.
CPC ....... H10D 30/668 (2025.01); H10D 30/0297 (2025.01); H10D 30/66 (2025.01);
(Continued)

(58) Field of Classification Search
None
See application file for complete search history.

(56) References Cited

U.S. PATENT DOCUMENTS 5,828,101 A 10/1998 Endo
9,029,979 B2 5/2015 Yoshimoto et al.
(Continued)

FOREIGN PATENT DOCUMENTS

JP H08-330601 A 12/1996
JP 2000-252463 A 9/2000
(Continued)

OTHER PUBLICATIONS

Notice of Reasons for Refusal (Office Action) dated Feb. 12, 2025 in corresponding Japanese Patent Application No. 2022-020517 with English machine translation (8 pages).

Primary Examiner — Julio J Maldonado
Assistant Examiner — Pinaki Das
(74) Attorney, Agent, or Firm — Kim & Stewart LLP

(57) ABSTRACT

According to one embodiment, a semiconductor device includes first and second electrodes, first to third semiconductor regions, first and second conductive parts, first and second gate electrodes, and a first connection part. The first semiconductor region is located on the first electrode. The second semiconductor region is located on the first semiconductor region. The third semiconductor region is located on a portion of the second semiconductor region. The first conductive part is located in the first semiconductor region with a first insulating part interposed. The first gate electrode is located in the first insulating part. The second conductive part is located in the first semiconductor region with a second insulating part interposed. The second gate electrode is located in the second insulating part. The first connection part is located higher than the second and third semiconductor regions. The second electrode is located on the second and third semiconductor regions.

16 Claims, 19 Drawing Sheets

(51) Int. Cl.
   *H10D 62/17* (2025.01)
   *H10D 64/00* (2025.01)
   *H10D 64/01* (2025.01)
   *H10D 64/27* (2025.01)

(52) U.S. Cl.
   CPC ........... *H10D 62/393* (2025.01); *H10D 64/01* (2025.01); *H10D 64/117* (2025.01); *H10D 64/519* (2025.01); *H10D 30/662* (2025.01); *H10D 30/665* (2025.01); *H10D 64/513* (2025.01); *H10D 64/518* (2025.01)

(56) References Cited

U.S. PATENT DOCUMENTS

| | | | |
|---|---|---|---|
| 10,340,346 B2 | 7/2019 | Katou et al. | |
| 2005/0145936 A1* | 7/2005 | Polzl | H10D 64/117 257/341 |
| 2009/0242976 A1 | 10/2009 | Hino | |
| 2010/0140695 A1* | 6/2010 | Yedinak | H10D 8/605 257/334 |
| 2015/0263110 A1 | 9/2015 | Kawaguchi et al. | |
| 2017/0263768 A1* | 9/2017 | Katoh | H10D 62/393 |
| 2018/0337171 A1* | 11/2018 | Losee | H10D 30/66 |
| 2019/0237567 A1 | 8/2019 | Nakatani | |
| 2021/0057574 A1 | 2/2021 | Nishiwaki et al. | |
| 2021/0057575 A1* | 2/2021 | Nishiwaki | H10D 30/668 |

FOREIGN PATENT DOCUMENTS

| | | |
|---|---|---|
| JP | 2003-318400 A | 11/2003 |
| JP | 2004-056003 A | 2/2004 |
| JP | 2009-246224 A | 10/2009 |
| JP | 2013-115158 A | 6/2013 |
| JP | 2015-176900 A | 10/2015 |
| JP | 2017-163122 A | 9/2017 |
| JP | 2019-057537 A | 4/2019 |
| JP | 2019129269 A | 8/2019 |
| JP | 2021034540 A | 3/2021 |

* cited by examiner

1

SEMICONDUCTOR DEVICE

CROSS-REFERENCE TO RELATED APPLICATIONS

This application is based upon and claims the benefit of priority from Japanese Patent Application No. 2022-020517, filed on Feb. 14, 2022; the entire contents of which are incorporated herein by reference.

FIELD

Embodiments described herein relate generally to a semiconductor device.

BACKGROUND

Semiconductor devices such as metal oxide semiconductor field effect transistors (MOSFETs) and the like are used in power conversion applications. It is desirable to reduce the number of processes necessary to manufacture the semiconductor device.

DETAILED DESCRIPTION

Figure 1:
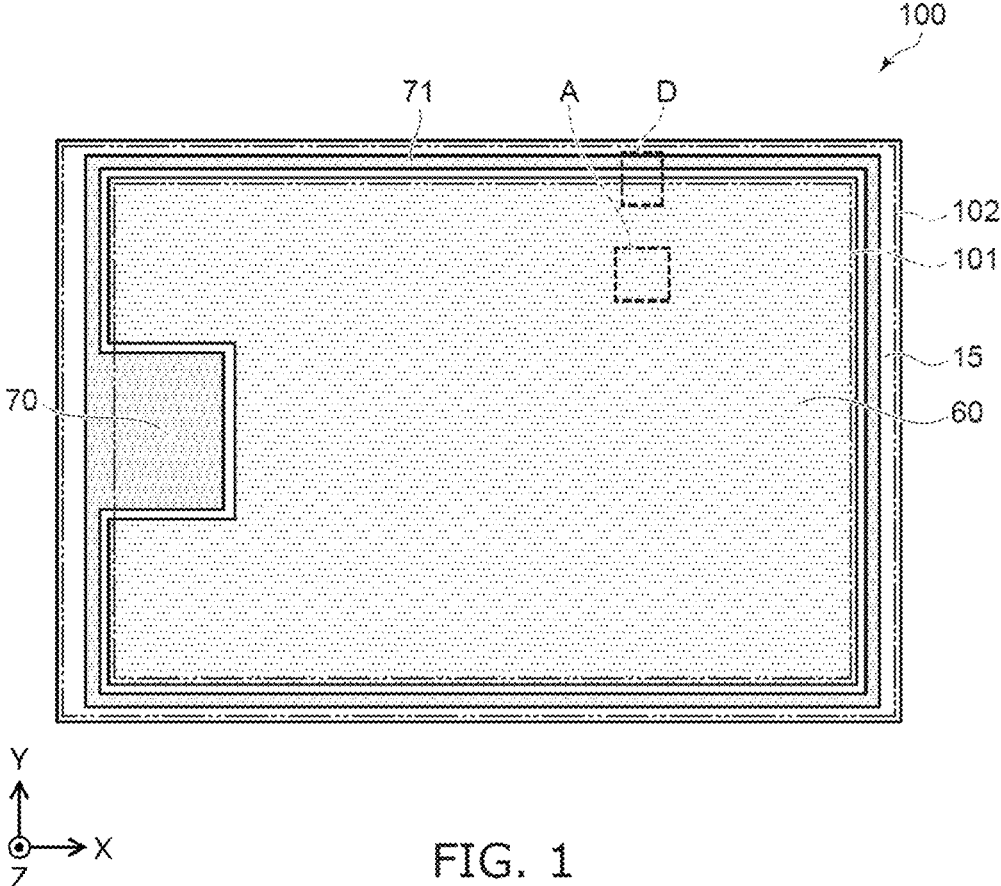
FIG. 1 is a plan view showing a semiconductor device according to a first embodiment.

According to one embodiment, a semiconductor device includes a first electrode, a first semiconductor region of a first conductivity type, a second semiconductor region of a second conductivity type, a third semiconductor region of the first conductivity type, a first conductive part, a first gate electrode, a second conductive part, a second gate electrode, a first connection part, and a second electrode. The first semiconductor region is located on the first electrode and electrically connected with the first electrode. The second semiconductor region is located on the first semiconductor region. The third semiconductor region is located on a portion of the second semiconductor region. The first conductive part is located in the first semiconductor region with a first insulating part interposed. The first gate electrode is located in the first insulating part. The first gate electrode faces the second semiconductor region in a second direction perpendicular to a first direction. The first direction is from the first electrode toward the first semiconductor region. The second conductive part is located in the first semiconductor region with a second insulating part interposed. The second conductive part is separated from the first conductive part in the second direction. The second gate electrode is located in the second insulating part. The second gate electrode faces the second semiconductor region in the second direction. The first connection part is located higher than the second and third semiconductor regions, extends in the second direction and contacts the first and second gate electrodes. The second electrode is located on the second and third semiconductor regions. The second electrode is electrically connected with the second semiconductor region, the third semiconductor region, the first conductive part, and the second conductive part.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$, $p^+$, and p indicate relative levels of the impurity concentrations. In other words, a notation marked with "+" indicates that the impurity concentration is relatively greater than that of a notation not marked with either "+" or "−"; and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In embodiments described below, each embodiment may be implemented by inverting the p-type and the n-type of the semiconductor regions.

Figure 2:
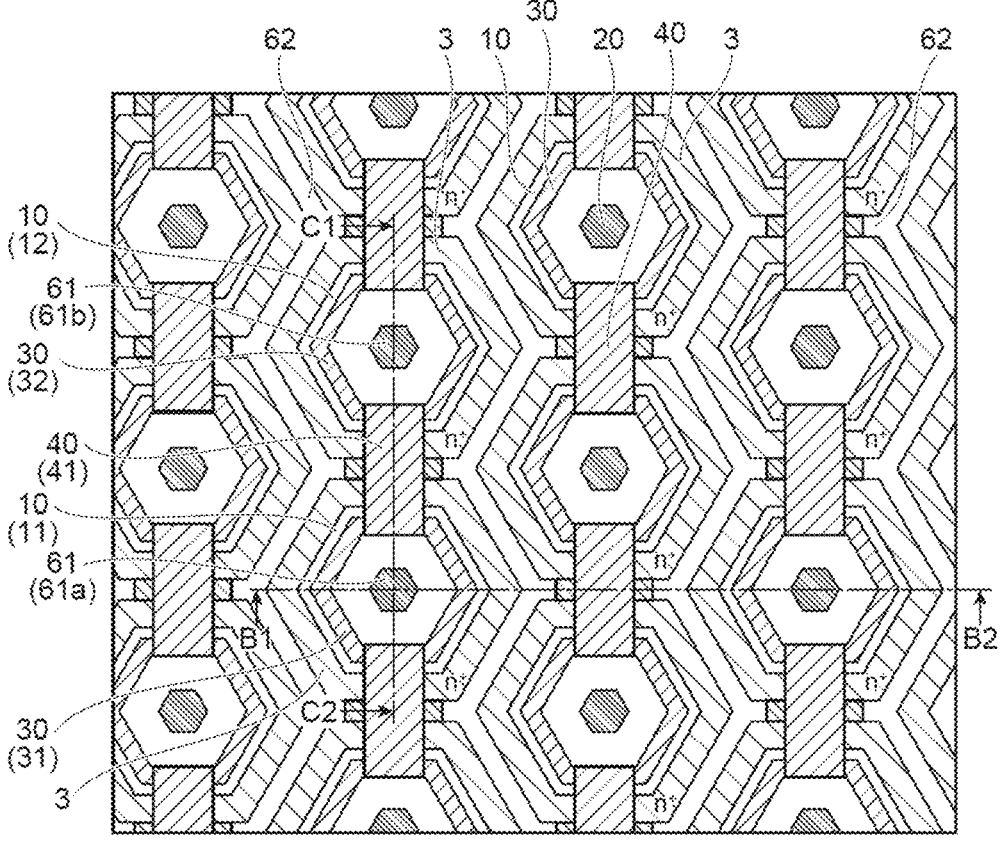
FIG. 2 is an enlarged plan view of portion A of FIG. 1.
Figure 2:
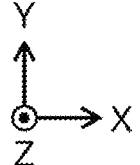
Figure 3:
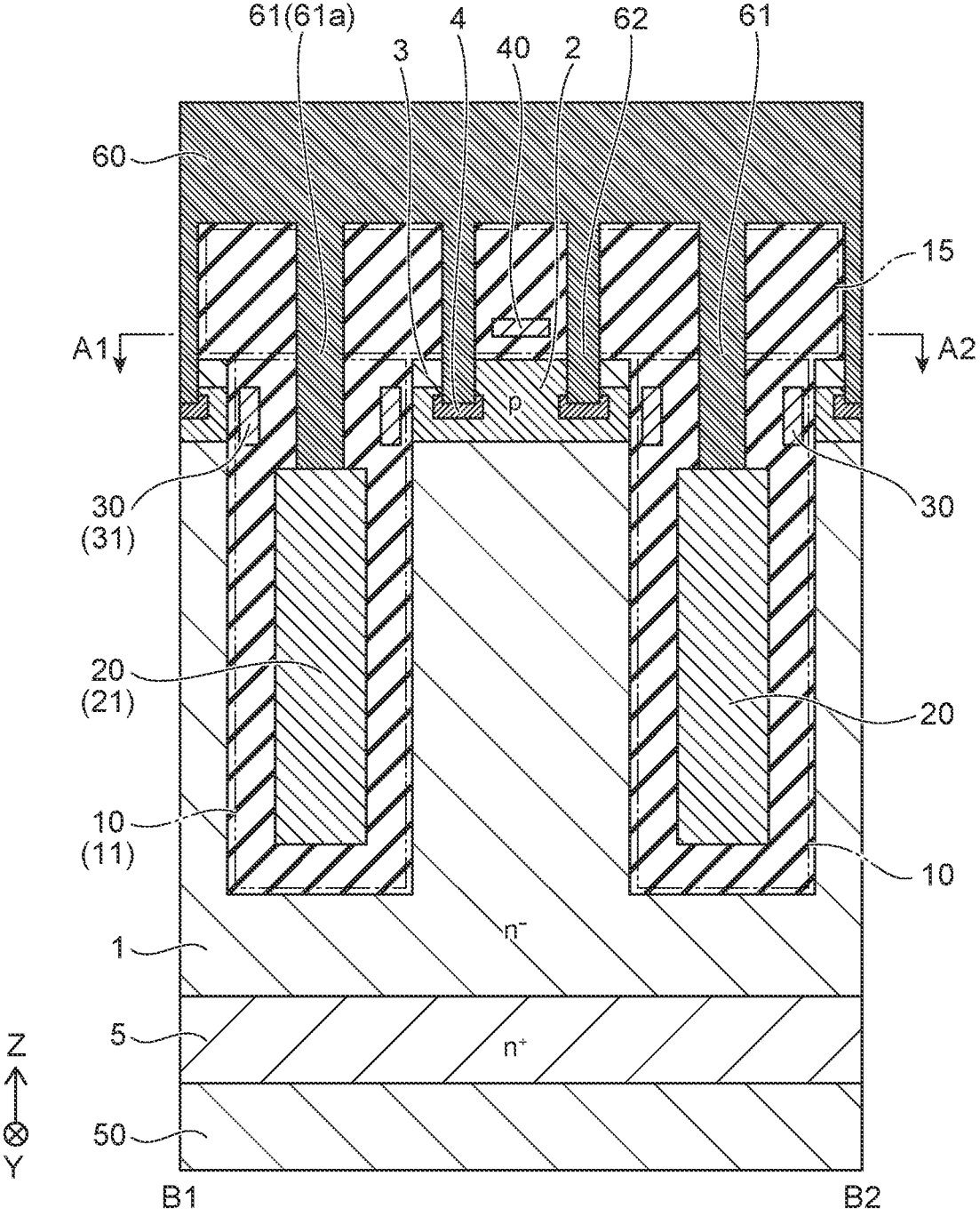
FIG. 3 is a B1-B2 cross-sectional view of FIG. 2.
Figure 4:
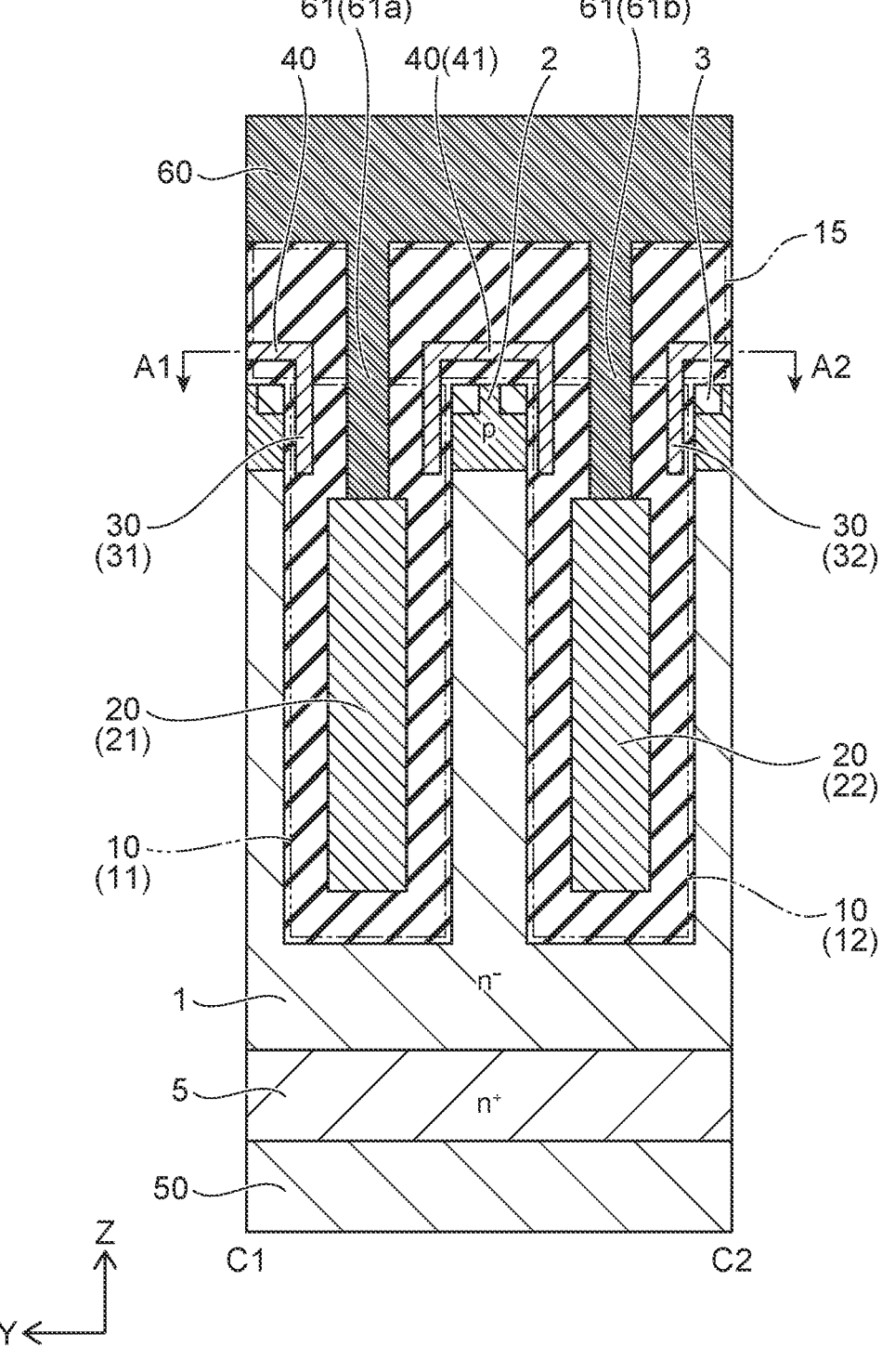
FIG. 4 is a C1-C2 cross-sectional view of FIG. 2.
Figure 5:
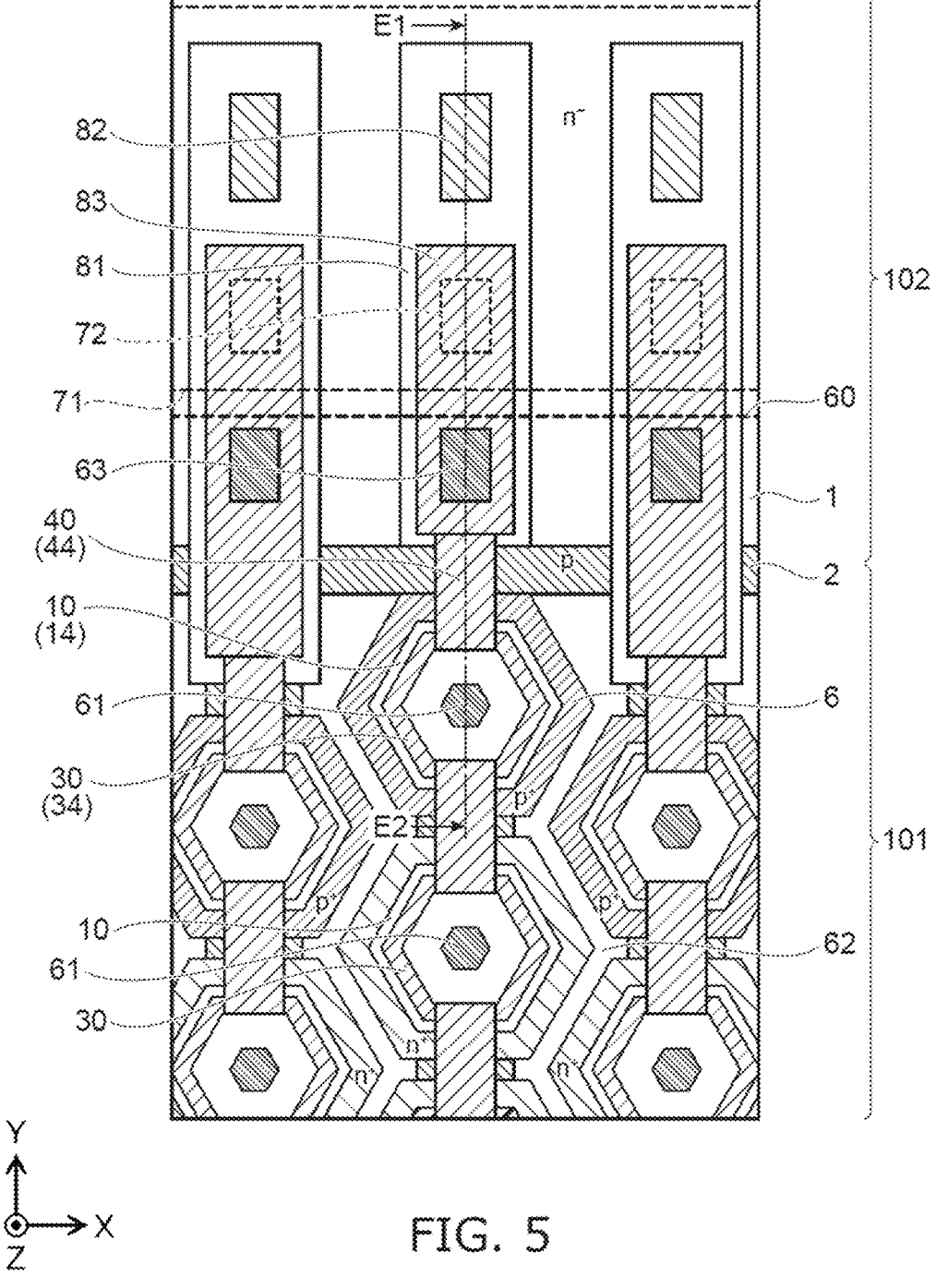
FIG. 5 is an enlarged plan view of portion D of FIG. 1.
Figure 6:
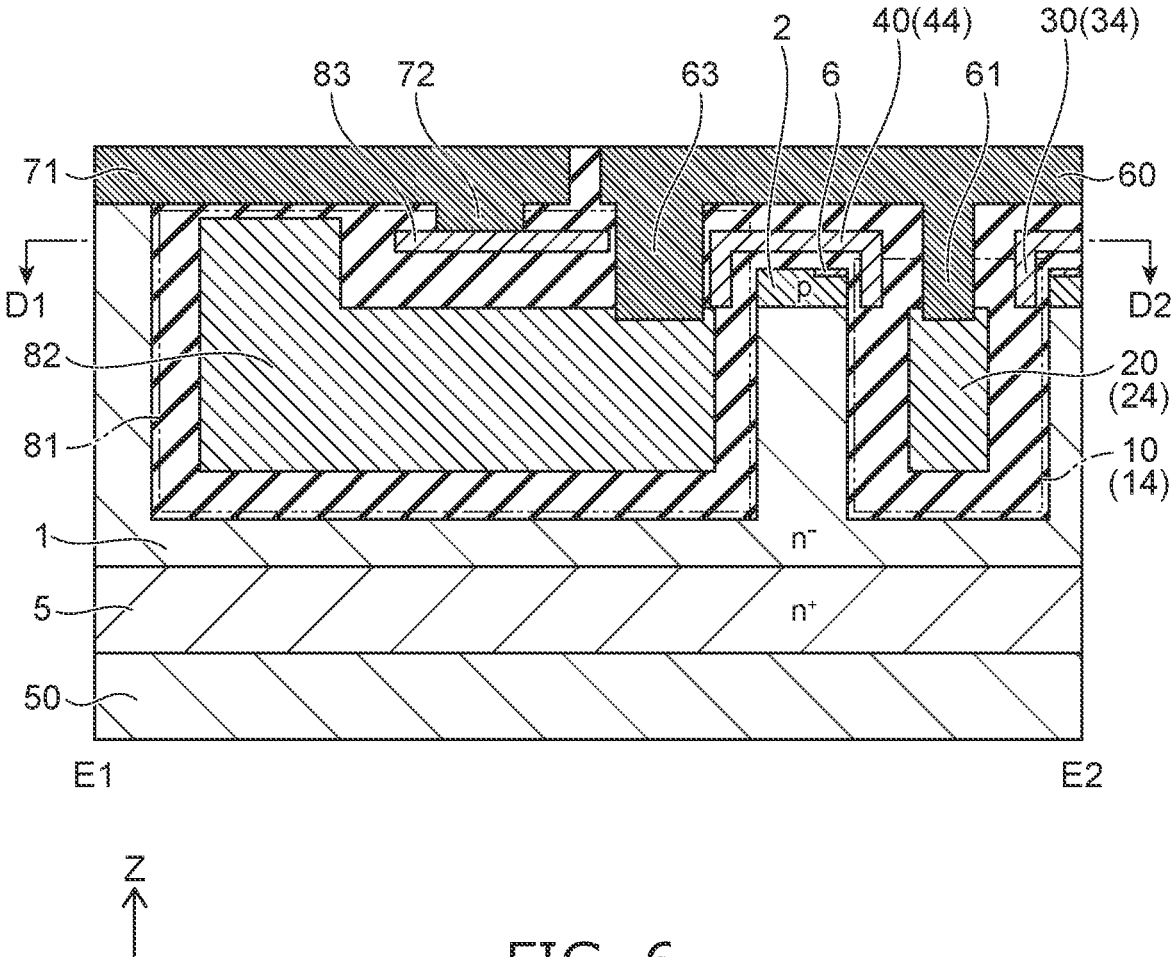
FIG. 6 is an E1-E2 cross-sectional view of FIG. 5.

FIG. 1 is a plan view showing a semiconductor device according to a first embodiment. FIG. 2 is an enlarged plan view of portion A of FIG. 1. FIG. 3 is a B1-B2 cross-sectional view of FIG. 2. FIG. 4 is a C1-C2 cross-sectional view of FIG. 2. FIG. 2 corresponds to an A1-A2 cross-sectional view of FIGS. 3 and 4. FIG. 5 is an enlarged plan view of portion D of FIG. 1. FIG. 6 is an E1-E2 cross-sectional view of FIG. 5. FIG. 5 corresponds to a D1-D2 cross-sectional view of FIG. 6.

The semiconductor device according to the first embodiment is a MOSFET. As shown in FIGS. 1 to 6, the semiconductor device 100 according to the first embodiment includes an n⁻-type (first-conductivity-type) drift region 1 (a first semiconductor region), a p-type (second-conductivity-type) base region 2 (a second semiconductor region), an n⁺-type source region 3 (a third semiconductor region), a p⁺-type contact region 4, an n⁺-type drain region 5, a p⁺-type contact region 6, an insulating part 10, an insulating part 15, a conductive part 20, a gate electrode 30, a drain electrode 50 (a first electrode), a source electrode 60 (a second electrode), a gate pad 70, gate wiring 71, an insulating part 81, a conductive part 82, and an electrode layer 83. The insulating part 15 is not illustrated in FIGS. 2 and 5.

An XYZ orthogonal coordinate system is used in the description of the embodiments. The direction from the drain electrode 50 toward the n⁻-type drift region 1 is taken as a Z-direction (a first direction). One direction orthogonal to the Z-direction is taken as an X-direction (a third direction). A direction that is orthogonal to the Z-direction and crosses the X-direction is taken as a Y-direction (a second direction). Herein, the direction from the drain electrode 50 toward the n⁻-type drift region 1 is called "up", and the opposite direction is called "down". These directions are based on the relative positional relationship between the drain electrode 50 and the n⁻-type drift region 1 and are independent of the direction of gravity.

As shown in FIG. 1, the source electrode 60, the gate pad 70, and the gate wiring 71 are located at the upper surface of the semiconductor device 100. The gate pad 70 and the gate wiring 71 are separated from the source electrode 60 and electrically isolated from the source electrode 60. The gate wiring 71 is located around the source electrode 60 in the X-Y plane (a first plane). The gate wiring 71 is electrically connected with the gate pad 70.

As shown in FIGS. 3 and 4, the drain electrode 50 is located at the lower surface of the semiconductor device 100. The n⁺-type drain region 5 is located on the drain electrode 50 and electrically connected with the drain electrode 50. The n⁻-type drift region 1 is located on the n⁺-type drain region 5. The n-type impurity concentration of the n⁻-type drift region 1 is less than the n-type impurity concentration of the n⁺-type drain region 5. The n⁻-type drift region 1 is electrically connected with the drain electrode 50 via the n⁺-type drain region 5.

As shown in FIG. 3, the p-type base region 2 is located on the n⁻-type drift region 1. The n⁺-type source region 3 and the p⁺-type contact region 4 are located respectively on portions of the p-type base region 2. The p-type impurity concentration of the p⁺-type contact region 4 is greater than the p-type impurity concentration of the p-type base region 2.

The conductive part 20 is located in the n⁻-type drift region 1 with the insulating part 10 interposed. The conductive part 20 faces the n⁻-type drift region 1 in the X-direction and the Y-direction. The gate electrode 30 is located in the insulating part 10 and faces the p-type base region 2 in the X-direction and the Y-direction. A portion of the insulating part 10 is positioned between the p-type base region 2 and the gate electrode 30 and functions as a gate insulating layer.

The source electrode 60 is located on the n⁺-type source region 3, the p⁺-type contact region 4, and the gate electrode 30 and is electrically connected with the n⁺-type source region 3, the p⁺-type contact region 4, and the conductive part 20. The p-type base region 2 is electrically connected with the source electrode 60 via the p⁺-type contact region 4. The gate electrode 30 is electrically isolated from the source electrode 60 by the insulating part 15.

The source electrode 60 includes an extension portion 61 and a contact portion 62. The extension portion 61 extends in the Z-direction and is located on the conductive part 20. The source electrode 60 is electrically connected with the conductive part 20 by the lower end of the extension portion 61 contacting the upper end of the conductive part 20. The contact portion 62 is located on the p⁺-type contact region 4. The source electrode 60 is electrically connected with the n⁺-type source region 3 and the p⁺-type contact region 4 by the lower portion of the contact portion 62 contacting these semiconductor regions.

As shown in FIG. 2, the gate electrode 30 is positioned around a portion of the extension portion 61 in the X-Y plane. The n⁺-type source region 3 is positioned around the gate electrode 30 in the X-Y plane.

As shown in FIGS. 2 to 4, a plurality of each of the n⁺-type source region 3, the conductive part 20, the gate electrode 30, and the extension portion 61 is arranged in the X-direction and the Y-direction. The contact portion 62 is positioned between the n⁺-type source regions 3 when viewed along the Z-direction.

A connection part 40 electrically connects the gate electrodes 30 that are next to each other. Specifically, the connection part 40 extends in the Y-direction; and the two Y-direction ends of the connection part 40 contact the gate electrodes 30 that are next to each other in the Y-direction. The gate electrodes 30 that are next to each other in the Y-direction are electrically connected thereby. As shown in FIG. 2, the length of the connection part 40 in the Y-direction is greater than the length of the connection part 40 in a direction perpendicular to the Y-Z plane. When viewed along the Z-direction, the gate electrode 30 and the connection part 40 are alternately arranged in the Y-direction.

As shown in FIG. 3, the connection part 40 is located higher than the p-type base region 2, the n⁺-type source region 3, and the p⁺-type contact region 4. A portion of the insulating part 15 is located between the connection part 40 and these semiconductor regions; and the connection part 40 is electrically isolated from these semiconductor regions. As shown in FIG. 4, the connection part 40 is positioned between the extension portions 61 that are next to each other in the Y-direction.

As a specific example shown in FIG. 2, the multiple insulating parts 10 include an insulating part 11 (a first insulating part) and an insulating part 12 (a second insulating part). The multiple conductive parts 20 include a conductive part 21 (a first conductive part) and a conductive part 22 (a second conductive part). The multiple gate electrodes 30 include a gate electrode 31 (a first gate electrode) and a gate electrode 32 (a second gate electrode). The multiple connection parts 40 include a connection part 41 (a first connection part). The multiple extension portions 61 include an extension portion 61a (a first extension portion) and an extension portion 61b (a second extension portion).

The conductive part 21 and the gate electrode 31 are located in the insulating part 11. The conductive part 22 and the gate electrode 32 are located in the insulating part 12. The conductive part 22 and the gate electrode 32 are next to the conductive part 21 and the gate electrode 31 in the Y-direction. The connection part 41 electrically connects the gate electrodes 31 and 32. The extension portion 61a contacts the conductive part 21. The extension portion 61b contacts the conductive part 22. The connection part 41 is positioned between the extension portion 61a and the extension portion 61b.

As shown in FIG. 1, the semiconductor device 100 includes a cell region 101 and a termination region 102. The termination region 102 is located around the cell region 101 in the X-Y plane. The source electrode 60 is located in the cell region 101. The gate wiring 71 is located in the termination region 102. The p-type base region 2, the n$^+$-type source region 3, the p$^+$-type contact region 4, the insulating part 10, the conductive part 20, the gate electrode 30, and the connection part 40 described above are located in the cell region 101.

As shown in FIGS. 5 and 6, the multiple insulating parts 10 include an insulating part 14 at the termination region 102 vicinity. The insulating part 14 is positioned at the end of the multiple insulating parts 10 arranged in the Y-direction. Similarly, the multiple conductive parts 20 include a conductive part 24. The conductive part 24 is positioned at the end of the multiple conductive parts 20 arranged in the Y-direction. The multiple gate electrodes 30 include a gate electrode 34. The gate electrode 34 is positioned at the end of the multiple gate electrodes 30 arranged in the Y-direction. The conductive part 24 and the gate electrode 34 are located in the insulating part 14.

The insulating part 81, the conductive part 82, and the electrode layer 83 are located in the termination region 102. As shown in FIG. 6, the conductive part 82 is located in the n$^-$-type drift region 1 with the insulating part 81 interposed. The conductive part 82 is electrically connected with the source electrode 60 by a contact portion 63 of the source electrode 60. The electrode layer 83 is located in the insulating part 81 and positioned on the conductive part 82. The electrode layer 83 is electrically isolated from the source electrode 60 and the conductive part 82.

The multiple connection parts 40 further include a connection part 44. The electrode layer 83 is electrically connected with the gate electrode 34 by the connection part 44. The gate wiring 71 is positioned on the electrode layer 83. The electrode layer 83 is electrically connected with the gate wiring 71 by a contact portion 72. The gate electrode 30 is electrically connected with the gate pad 70 via the electrode layer 83 and the gate wiring 71. In FIG. 5, the insulating part 15 is not illustrated, and the source electrode 60, the gate wiring 71, and the contact portion 72 are shown by broken lines.

The p$^+$-type contact region 6 is located around the gate electrode 34 in the X-Y plane. The p-type impurity concentration of the p$^+$-type contact region 6 is greater than the p-type impurity concentration of the p-type base region 2. The n$^+$-type source region 3 is not located around the gate electrode 34. As shown in FIG. 5, the contact portion 62 is located around the p$^+$-type contact region 6 in the X-Y plane; and the p$^+$-type contact region 6 is electrically connected with the contact portion 62.

Operations of the semiconductor device 100 will now be described.

A voltage that is not less than a threshold is applied to the gate electrode 30 in a state in which a positive voltage with respect to the source electrode 60 is applied to the drain electrode 50. Thereby, a channel (an inversion layer) is formed in the p-type base region 2; and the semiconductor device 100 is set to the on-state. Electrons flow from the source electrode 60 toward the drain electrode 50 via the channel. When the voltage that is applied to the gate electrode 30 drops below the threshold, the channel of the p-type base region 2 disappears, and the semiconductor device 100 switches to the off-state.

When the semiconductor device 100 switches to the off-state, the positive voltage that is applied to the drain electrode 50 increases with respect to the source electrode 60. At this time, a depletion layer spreads from the interface between the insulating part 10 and the n$^-$-type drift region 1 toward the n$^-$-type drift region 1. The breakdown voltage of the semiconductor device 100 can be increased by the spreading of the depletion layer. Or, the n-type impurity concentration in the n$^-$-type drift region 1 can be increased and the on-resistance of the semiconductor device 100 can be reduced while maintaining the breakdown voltage of the semiconductor device 100.

Examples of the materials of the components of the semiconductor device 100 will now be described.

The n$^-$-type drift region 1, the p-type base region 2, the n$^+$-type source region 3, the p$^+$-type contact region 4, the n$^-$-type drain region 5, and the p$^+$-type contact region 6 include a semiconductor material. Silicon, silicon carbide, gallium nitride, or gallium arsenide can be used as the semiconductor material. Arsenic, phosphorus, or antimony can be used as the n-type impurity. Boron can be used as the p-type impurity.

The insulating part 10 and the insulating part 15 include insulating materials. For example, the insulating part 10 and the insulating part 15 include silicon oxide, silicon nitride, or silicon oxynitride. The conductive part 20, the gate electrode 30, and the connection part 40 include polysilicon. An n-type or p-type impurity may be added to the conductive part 20, the gate electrode 30, and the connection part 40. The drain electrode 50, the source electrode 60, and the gate pad 70 include metals such as titanium, tungsten, aluminum, etc. Instead of polysilicon, the connection part 40 may include a metal similarly to the drain electrode 50, etc.

FIGS. 7A to 11B are cross-sectional views showing a method for manufacturing the semiconductor device according to the first embodiment.

Figures 7A, 7B:
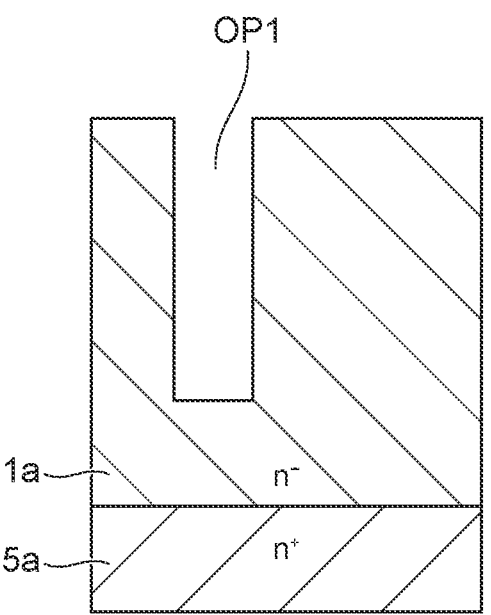
FIGS. 7A and 7B are cross-sectional views showing a method for manufacturing the semiconductor device according to the first embodiment.

First, a semiconductor substrate that includes an n$^+$-type semiconductor layer 5a is prepared. An n$^-$-type semiconductor layer 1a is formed by epitaxially growing a semiconductor material on the n$^+$-type semiconductor layer 5a. As shown in FIG. 7A, an opening OP1 is formed in the n$^-$-type semiconductor layer 1a by reactive ion etching (RIE). Multiple openings OP1 are formed in the X-direction and the Y-direction.

An insulating layer 10a is formed along the inner surface of the opening OP1 and the upper surface of the n$^-$-type semiconductor layer 1a by thermal oxidation or chemical vapor deposition (CVD). A conductive layer is formed on the insulating layer 10a by CVD. The upper surface of the conductive layer is caused to recede by chemical dry etching (CDE) or wet etching. Thereby, as shown in FIG. 7B, a conductive layer 20a is formed inside the opening OP1.

Figure 8A:
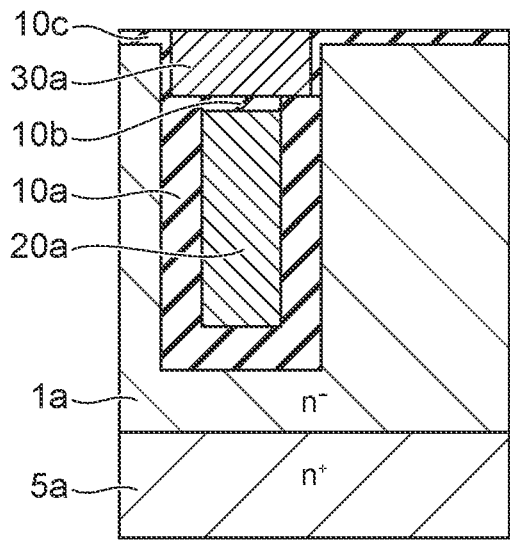
FIGS. 8A and 8B are cross-sectional views showing a method for manufacturing the semiconductor device according to the first embodiment.

An insulating layer 10b is formed on the insulating layer 10a and the conductive layer 20a by CVD. The upper surface of the insulating layer 10a and the upper surface of the insulating layer 10b are caused to recede by CDE or wet etching. An insulating layer 10c is formed along the inner surface of the opening OP1 and the upper surface of the n$^-$-type semiconductor layer 1a by thermal oxidation. A conductive layer is formed on the insulating layer 10c by CVD. The upper surface of the conductive layer is caused to recede by chemical mechanical polishing (CMP). Thereby, as shown in FIG. 8A, a conductive layer 30a is formed inside the opening OP1.

Figure 8B:
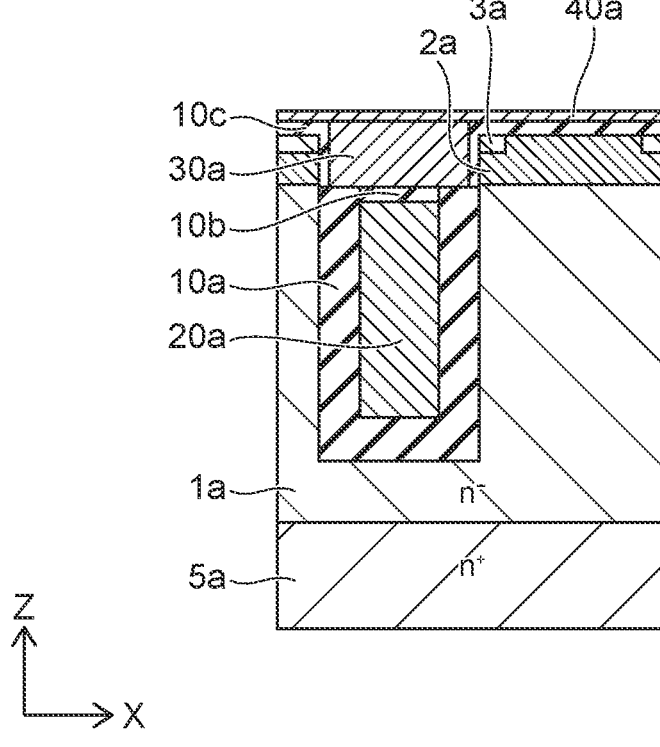

A p-type semiconductor region 2a and an n$^+$-type semiconductor region 3a are formed by sequentially ion-implanting a p-type impurity and an n-type impurity into the upper surface of the n$^-$-type semiconductor layer 1a. As shown in FIG. 8B, a thin conductive layer 40a is formed on the insulating layer 10c and the conductive layer 30a by CVD.

Figures 9A, 9B:
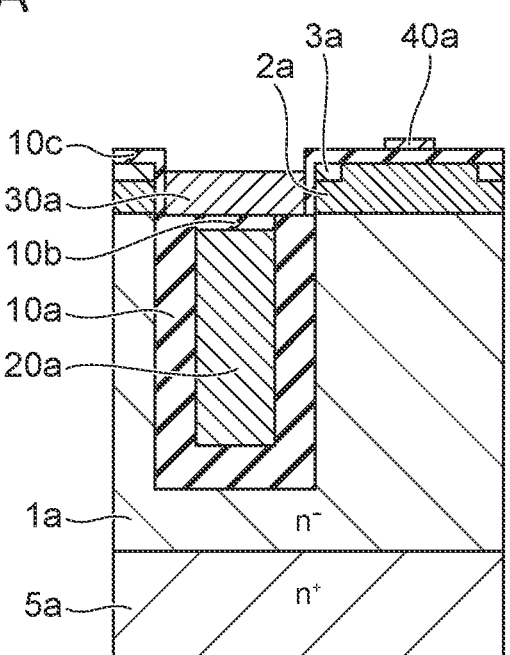
FIGS. 9A and 9B are cross-sectional views showing a method for manufacturing the semiconductor device according to the first embodiment.

As shown in FIG. 9A, the conductive layer 40a is patterned so that only a portion of the conductive layer 40a remains.

The centers in the X-Y plane of the conductive layer 30a and the insulating layer 10b are removed by RIE. An insulating layer 15a that covers the conductive layers 30a and 40a is formed. As shown in FIG. 9B, an opening OP2 that extends through the insulating layer 15a and the n⁺-type semiconductor region 3a and reaches the p-type semiconductor region 2a is formed by RIE.

Figure 10A:
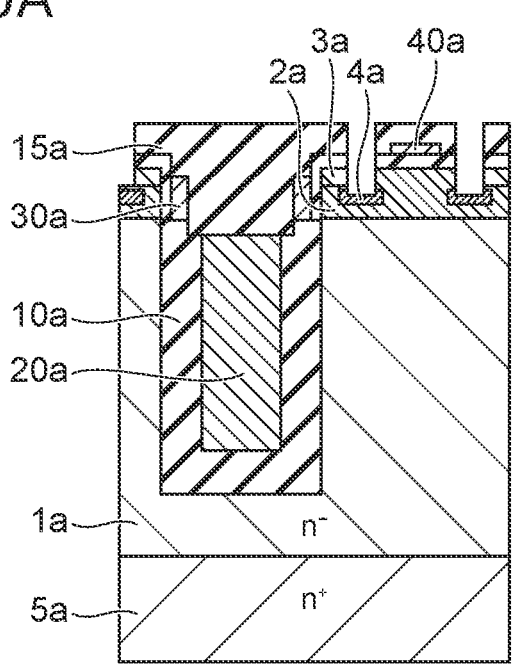
FIGS. 10A and 10B are cross-sectional views showing a method for manufacturing the semiconductor device according to the first embodiment.
Figure 10B:
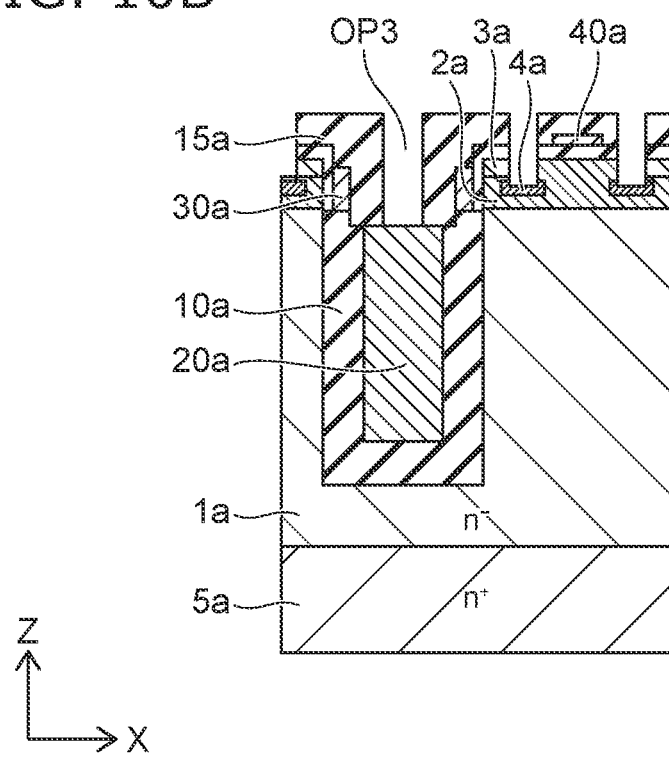
Figure 11A:
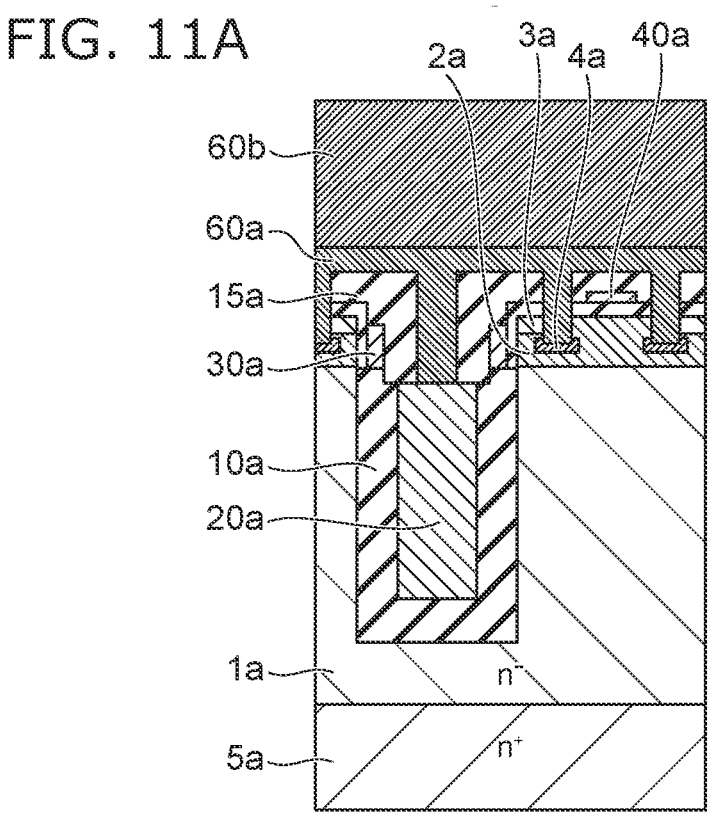
FIGS. 11A and 11B are cross-sectional views showing a method for manufacturing the semiconductor device according to the first embodiment.

A p⁺-type semiconductor region 4a is formed by ion-implanting a p-type impurity into the p-type semiconductor region 2a via the opening OP2. As shown in FIG. 10B, an opening OP3 that extends through the insulating layer 15a and reaches the conductive layer 20a is formed by RIE. A barrier metal 60a that fills the openings OP2 and OP3 is formed by CVD. For example, the barrier metal 60a has a stacked structure of a titanium nitride layer, a titanium layer, and a tungsten layer. As shown in FIG. 11A, an aluminum layer 60b is formed on the barrier metal 60a by sputtering.

Figure 11B:
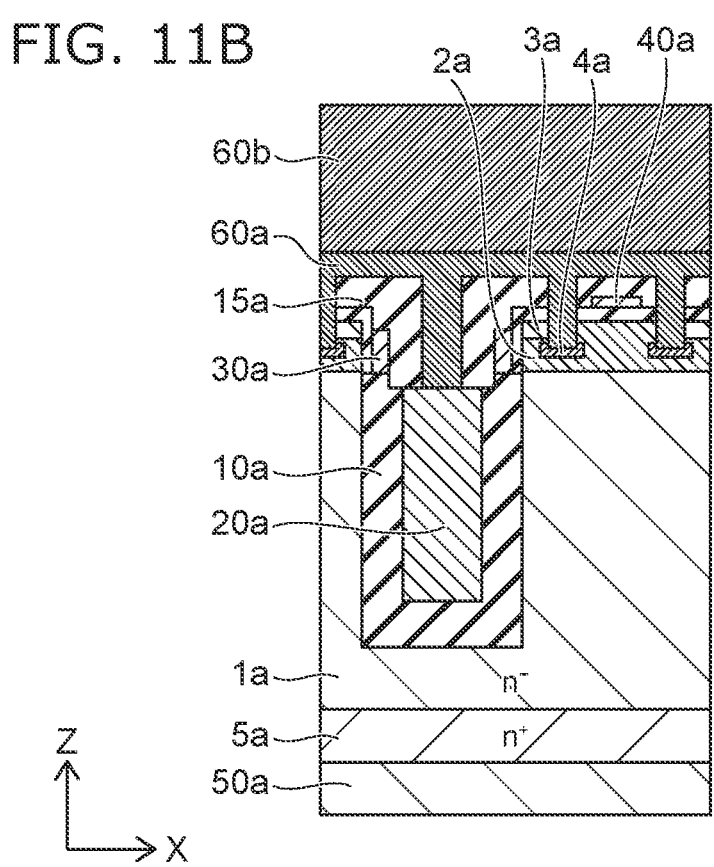

The barrier metal 60a and the aluminum layer 60b are patterned to form the source electrode 60, the gate pad 70, and the gate wiring 71. The lower surface of the n⁺-type semiconductor layer 5a is polished until the n⁺-type semiconductor layer 5a has a prescribed thickness. As shown in FIG. 11B, an aluminum layer 50a is formed at the lower surface of the n⁺-type semiconductor layer 5a by sputtering. Thus, the semiconductor device 100 is manufactured.

The n⁻-type semiconductor layer 1a shown in FIG. 11B corresponds to the n⁻-type drift region 1 of the semiconductor device 100 shown in FIGS. 1 to 6. The p-type semiconductor region 2a corresponds to the p-type base region 2. The n⁺-type semiconductor region 3a corresponds to the n⁺-type source region 3. The p⁺-type semiconductor region 4a corresponds to the p⁺-type contact region 4. The n⁺-type semiconductor layer 5a corresponds to the n⁺-type drain region 5. The insulating layer 10a, the insulating layer 10c, and a portion of the insulating layer 15a correspond to the insulating part 10. Another portion of the insulating layer 15a corresponds to the insulating part 15. The conductive layer 20a corresponds to the conductive part 20. The conductive layer 30a corresponds to the gate electrode 30. The conductive layer 40a corresponds to the connection part 40. The aluminum layer 50a corresponds to the drain electrode 50. The patterned barrier metal 60a and aluminum layer 60b correspond to the source electrode 60, the gate pad 70, and the gate wiring 71.

Advantages of the first embodiment will now be described.

Figure 12:
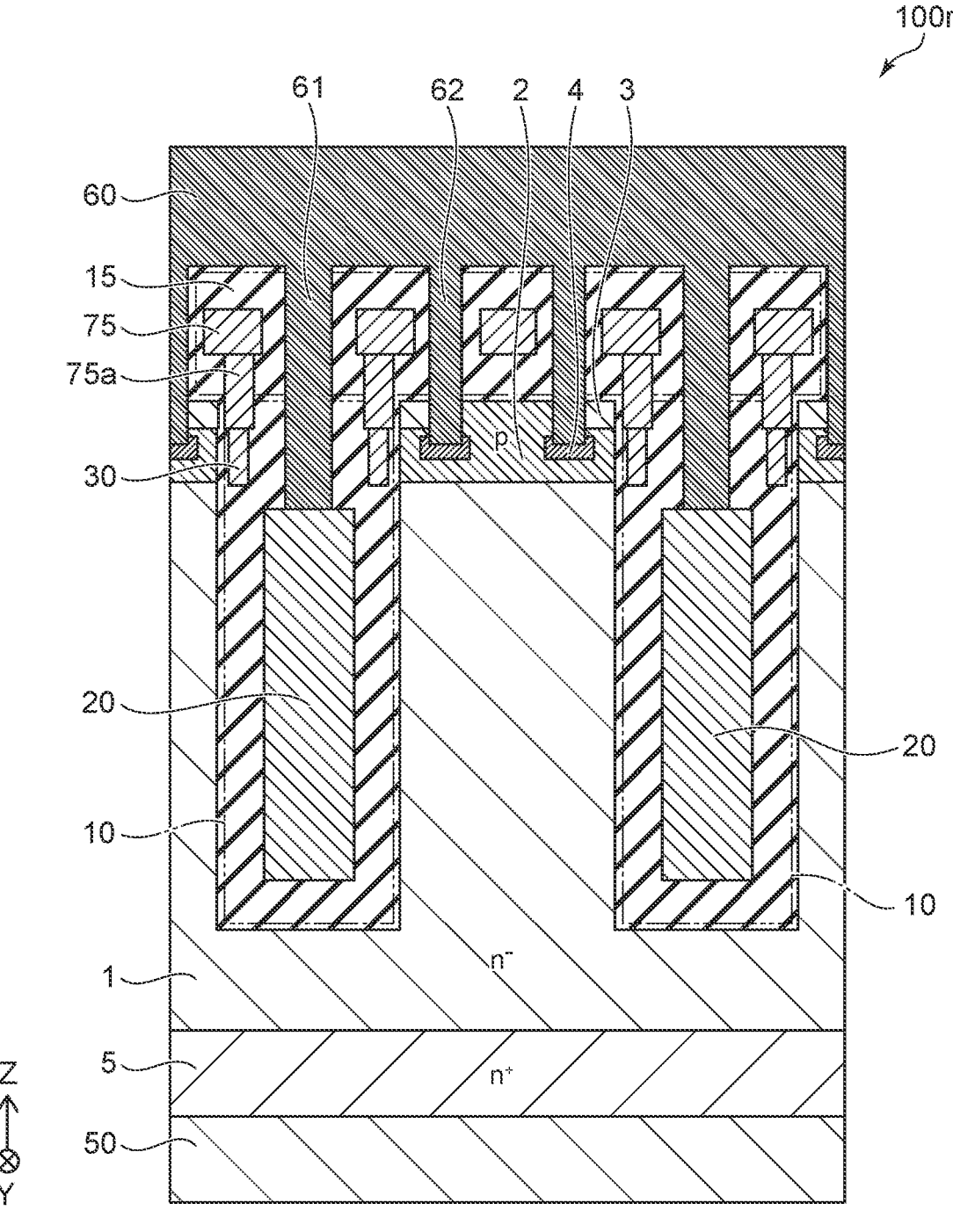
FIG. 12 is a cross-sectional view showing a portion of a semiconductor device according to a reference example.

FIG. 12 is a cross-sectional view showing a portion of a semiconductor device according to a reference example.

The semiconductor device 100r shown in FIG. 12 includes a gate wiring layer 75, and does not include the connection part 40 and the gate wiring 71. The gate wiring layer 75 spreads along the X-Y plane and is electrically connected with a not-illustrated gate pad 70. The gate wiring layer 75 is electrically connected with the gate electrode 30 via a contact portion 75a extending in the Z-direction. The gate wiring layer 75 includes a metal such as aluminum, etc.

In the semiconductor device 100r, similarly to the semiconductor device 100, multiple conductive parts 20 and multiple gate electrodes 30 are arranged in the X-direction and the Y-direction. According to this structure, the volume of the n⁻-type drift region 1 is increased compared to when the conductive part 20 and the gate electrode 30 extend in one direction. The current path in the on-state is increased, and the on-resistances of the semiconductor devices 100 and 100r can be reduced.

On the other hand, it is necessary for the conductive part 20 and the gate electrode 30 to be electrically connected with the source electrode 60 and the gate pad 70 while being electrically isolated from each other. In the semiconductor device 100r, the gate wiring layer 75 is included for the electrical connection between the gate electrode 30 and the gate pad 70. When the gate wiring layer 75 is included, more processes are necessary for manufacturing, such as the formation of the contact portion 75a, the patterning of the gate wiring layer 75, the separation of the gate wiring layer 75 and the source electrode 60, etc. Although the channel surface area (the channel density) per unit area can be increased as the insulating part 10, the conductive part 20, and the gate electrode 30 are downscaled, it is difficult to downscale the gate electrode 30 when the misalignment and the like of the contact portion 75a are considered.

For these problems, the gate electrodes 30 of the semiconductor device 100 are electrically connected to each other by the connection part 40. The connection part 40 extends in the Y-direction and contacts the gate electrodes 30 that are next to each other in the Y-direction. The gate electrodes 30 are electrically connected with the gate pad 70 via the connection parts 40. Therefore, the gate wiring layer 75 for electrically connecting the gate electrode 30 and the gate pad 70 is unnecessary in the semiconductor device 100. According to the first embodiment, the number of processes when manufacturing the semiconductor device 100 can be reduced. Because the contact portion 75a for connecting the gate electrode 30 and the gate wiring layer 75 also is unnecessary, the gate electrode 30 can be downscaled. As a result, the on-resistance of the semiconductor device 100 can be further reduced.

The electrical resistance of the connection part 40 can be greater when the connection part 40 includes polysilicon than when the connection part 40 includes a metal. By increasing the electrical resistance of the connection part 40, the change of the voltage with respect to time (dV/dt) when switching the semiconductor device 100 to the off-state can be reduced. The oscillation of the voltages of the gate electrode 30 and the connection part 40 at turn-off can be reduced thereby, and the noise caused by the oscillation of the voltages can be reduced. A metal such as tungsten or the like may be used as the connection part 40 when the electrical resistance of the gate electrode 30 is sufficiently large and it is unnecessary to increase the electrical resistance of the connection part 40.

The p⁺-type contact region 6 is located around the gate electrode 34 instead of the n⁺-type source region 3 at the termination region 102 vicinity. By including the p⁺-type contact region 6, the carriers that are generated in the termination region 102 when avalanche breakdown occurs are easily discharged to the source electrode 60. For example, fluctuation of the potential of the p-type base region 2 at the termination region 102 vicinity can be suppressed, and the operation of a parasitic bipolar transistor can be suppressed. In other words, the avalanche resistance can be improved. When more priority is given to reducing the on-resistance of the semiconductor device 100, the n⁺-type source region 3 may be included instead of the p⁺-type contact region 6.

Modifications

Figure 13:
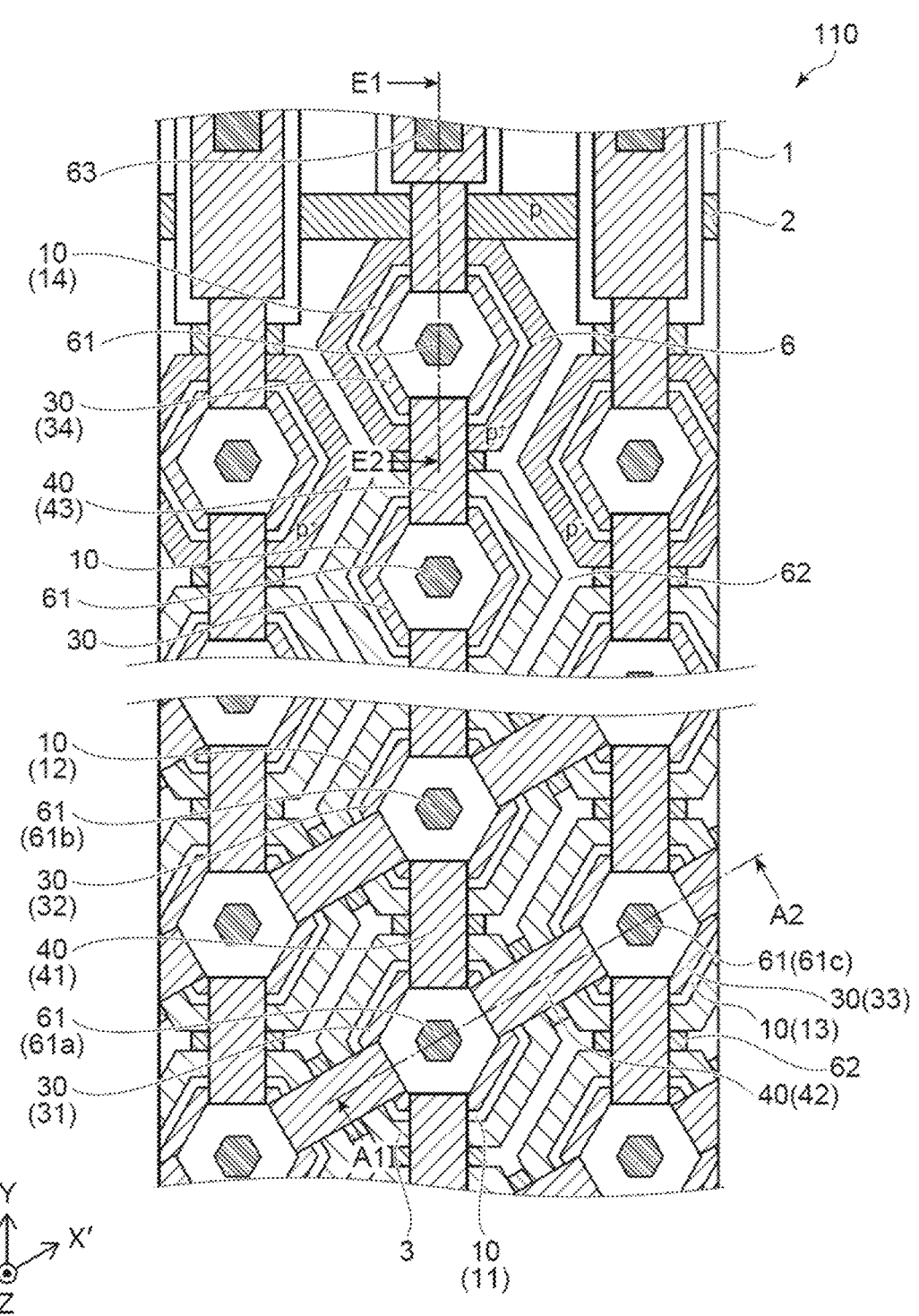
FIG. 13 is a plan view showing a portion of a semiconductor device according to a modification of the first embodiment.
Figure 14:
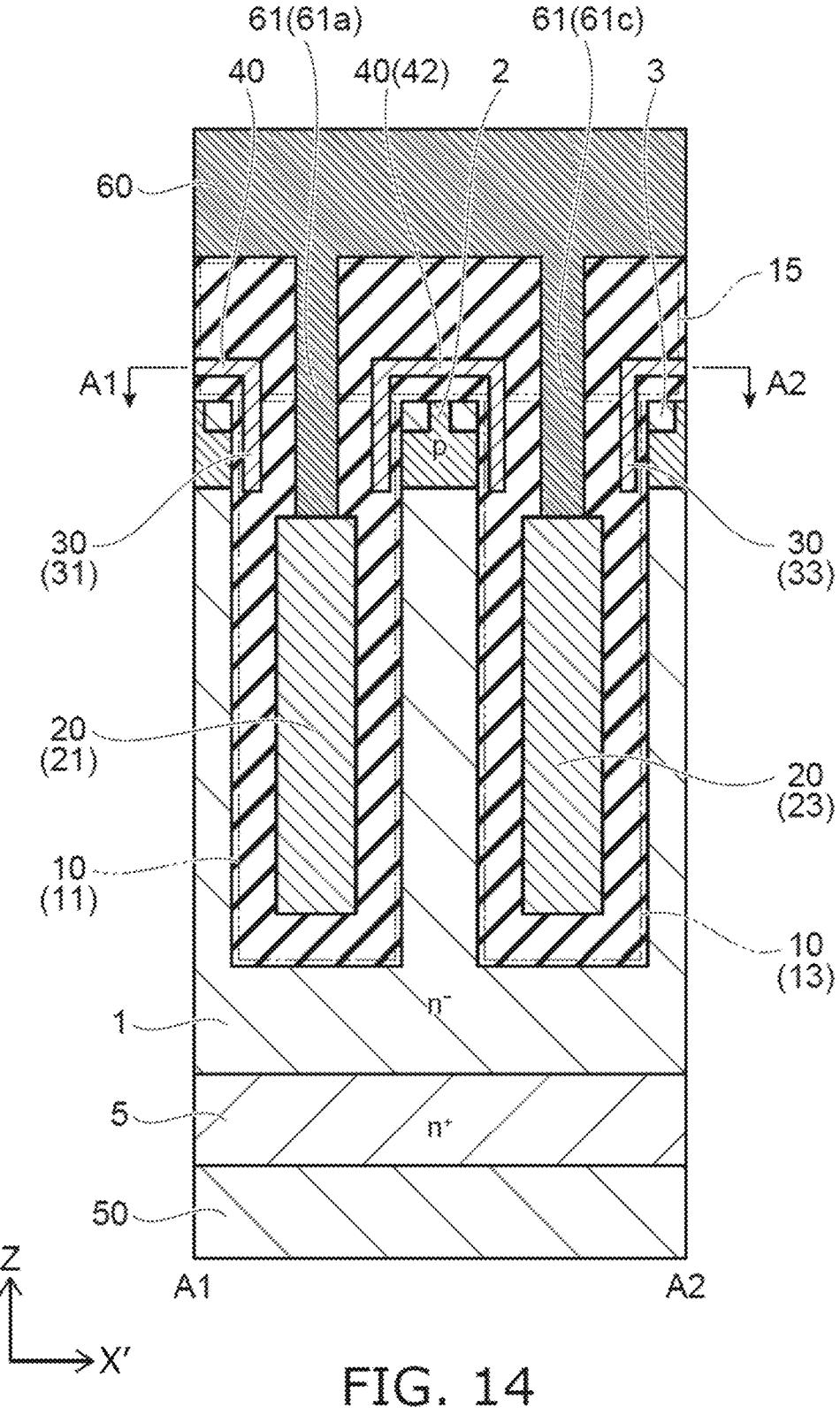
FIG. 14 is an A1-A2 cross-sectional view of FIG. 13.
Figure 15:
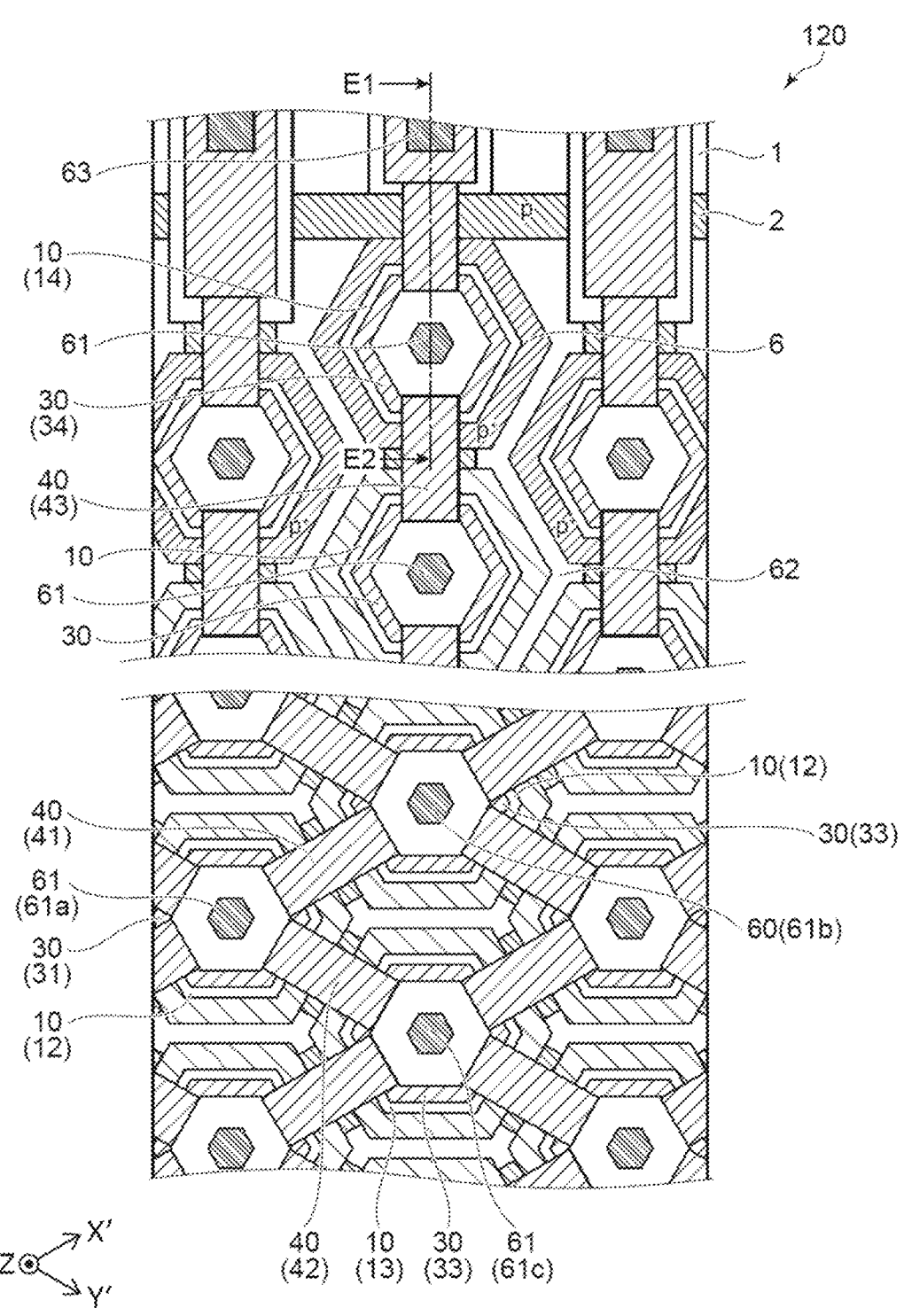
FIG. 15 is a plan view showing a portion of a semiconductor device according to a modification of the first embodiment.
Figure 16:
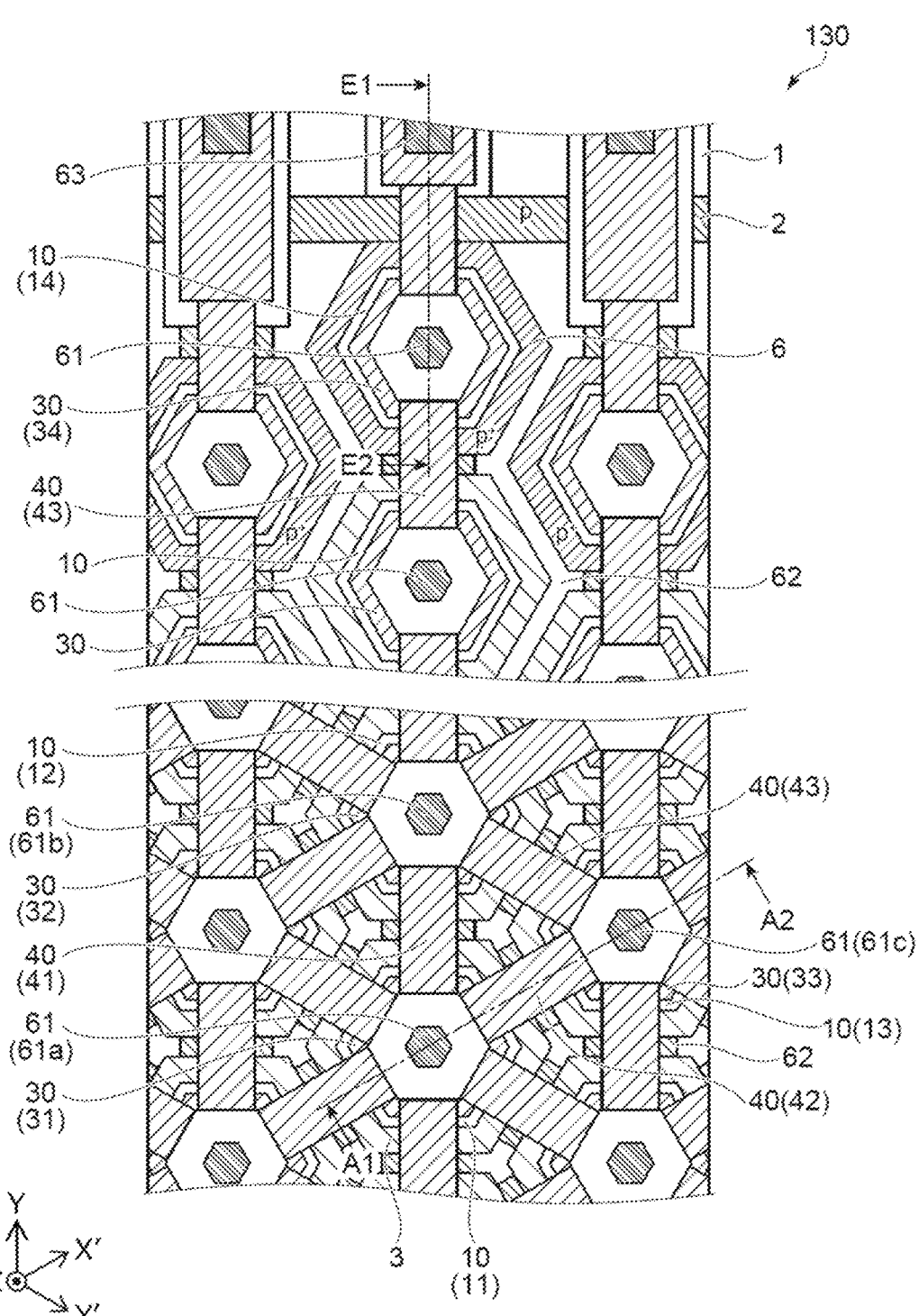
FIG. 16 is a plan view showing a portion of a semiconductor device according to a modification of the first embodiment.

FIG. 13, FIG. 15, and FIG. 16 are plan views showing portions of semiconductor devices according to modifications of the first embodiment. FIG. 14 is an A1-A2 cross-sectional view of FIG. 13. The insulating part 15 is not illustrated in FIG. 13, FIG. 15, and FIG. 16.

In the semiconductor device 110 shown in FIGS. 13 and 14 and the semiconductor device 120 shown in FIG. 15, a portion of the multiple connection parts 40 extends in the Y-direction. Another portion of the multiple connection parts 40 extends in an X'-direction and/or Y'-direction. The two ends of the connection part 40 extending in the X'-direction and/or Y'-direction respectively contact the gate electrodes 30 that are next to each other in the X'-direction and/or Y'-direction. Thereby, the gate electrodes 30 that are next to each other in the X'-direction and/or Y'-direction are electrically connected to each other.

As a specific example shown in FIGS. 13 and 14, the multiple insulating parts 10 further include an insulating part 13 (a third insulating part). The multiple conductive parts 20 further include a conductive part 23 (a third conductive part). The multiple gate electrodes 30 further include a gate electrode 33 (a third gate electrode). The multiple connection parts 40 further include a connection part 42 (a second connection part). The multiple extension portions 61 further include an extension portion 61c (a third extension portion).

The conductive part 23 and the gate electrode 33 are located in the insulating part 13. The conductive part 23 and the gate electrode 33 are next to the conductive part 21 and the gate electrode 31 in the X'-direction and/or Y'-direction. The connection part 42 electrically connects the gate electrodes 31 and 33. The extension portion 61c contacts the conductive part 23. The connection part 42 is positioned between the extension portion 61a and the extension portion 61c.

In the semiconductor device 110, the insulating part 14, the conductive part 24, and the gate electrode 34 are arranged with the insulating part 81, the conductive part 82, and the electrode layer 83 in the extension direction of a portion of the connection parts 40.

In the semiconductor device 120, the insulating part 14, the conductive part 24, and the gate electrode 34 are arranged with the insulating part 81, the conductive part 82, and the electrode layer 83 in directions crossing the extension directions of the connection parts 40.

In the semiconductor device 130 shown in FIG. 16, the multiple connection parts 40 include a connection part 43 (a third connection part). The connection part 43 extends in a direction crossing the X'-direction and the Y'-direction. The connection part 43 electrically connects the gate electrodes 32 and 33 that are next to each other in the extension direction.

As long as the connection part 40 electrically connects the gate electrodes 30 that are next to each other as in the semiconductor devices 110 to 130, the extension directions of the connection parts 40 are modifiable as appropriate. As long as each gate electrode 30 is electrically connected with the gate pad 70, the number of the connection parts 40 also is modifiable as appropriate.

According to the semiconductor device 100, the surface area of the n⁺-type source region 3 and the surface area of the p⁺-type contact region 4 are greater than those of the semiconductor devices 110 to 130. The carriers that are generated when avalanche breakdown occurs are easily discharged to the source electrode 60. Therefore, the avalanche resistance of the semiconductor device 100 can be improved.

On the other hand, the number of the connection parts 40 according to the semiconductor devices 110 to 130 is greater than in the semiconductor device 100. The gate resistance between the gate pad 70 and the gate electrode 30 decreases as the number of the connection parts 40 increases. For example, the fluctuation duration of the potential of the gate electrode 30 when switching can be reduced, and the operation of the semiconductor device can be stabilized. In particular, the gate resistance of the semiconductor device 130 can be further reduced because the semiconductor device 130 includes more connection parts 40 than the semiconductor devices 110 and 120.

Second Embodiment

Figure 17:
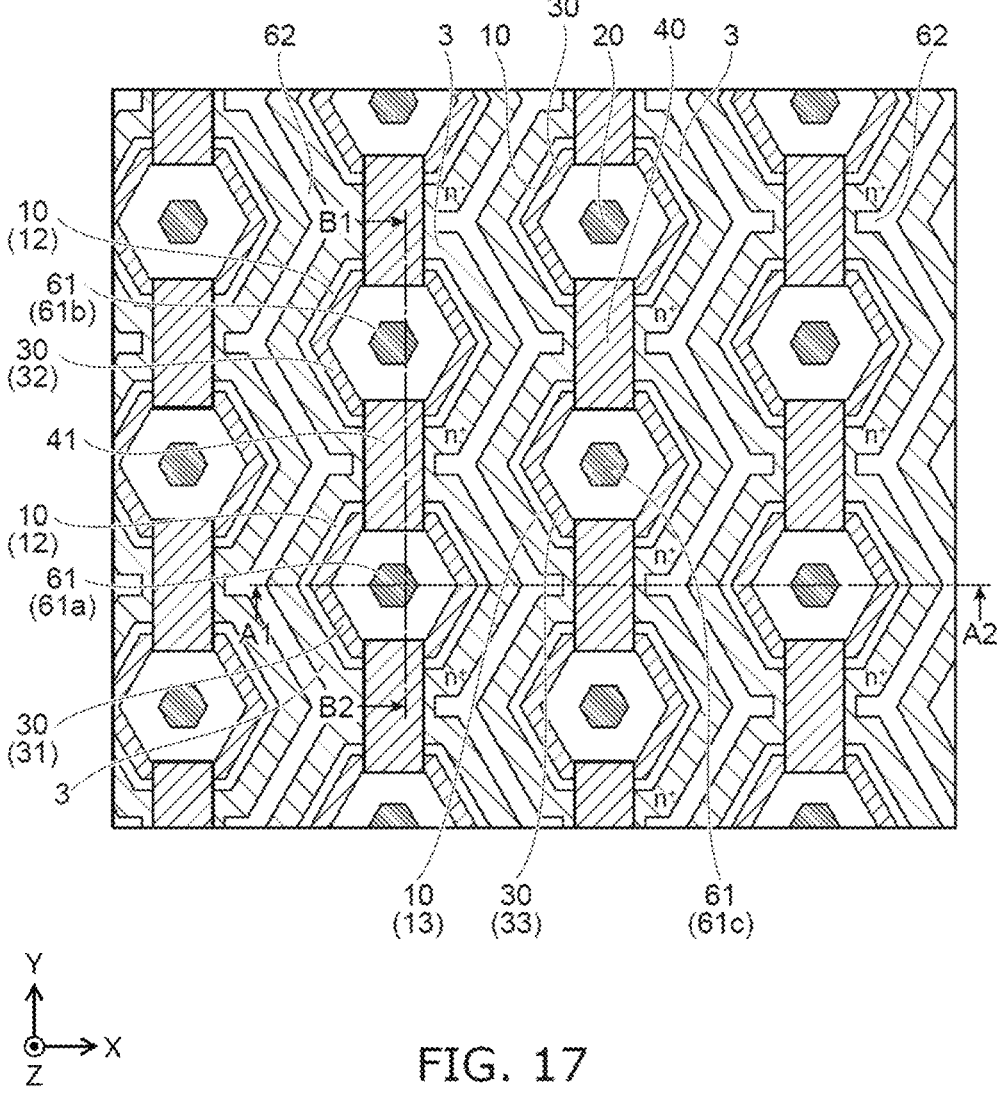
FIG. 17 is a plan view showing a portion of a semiconductor device according to a second embodiment.
Figure 18:
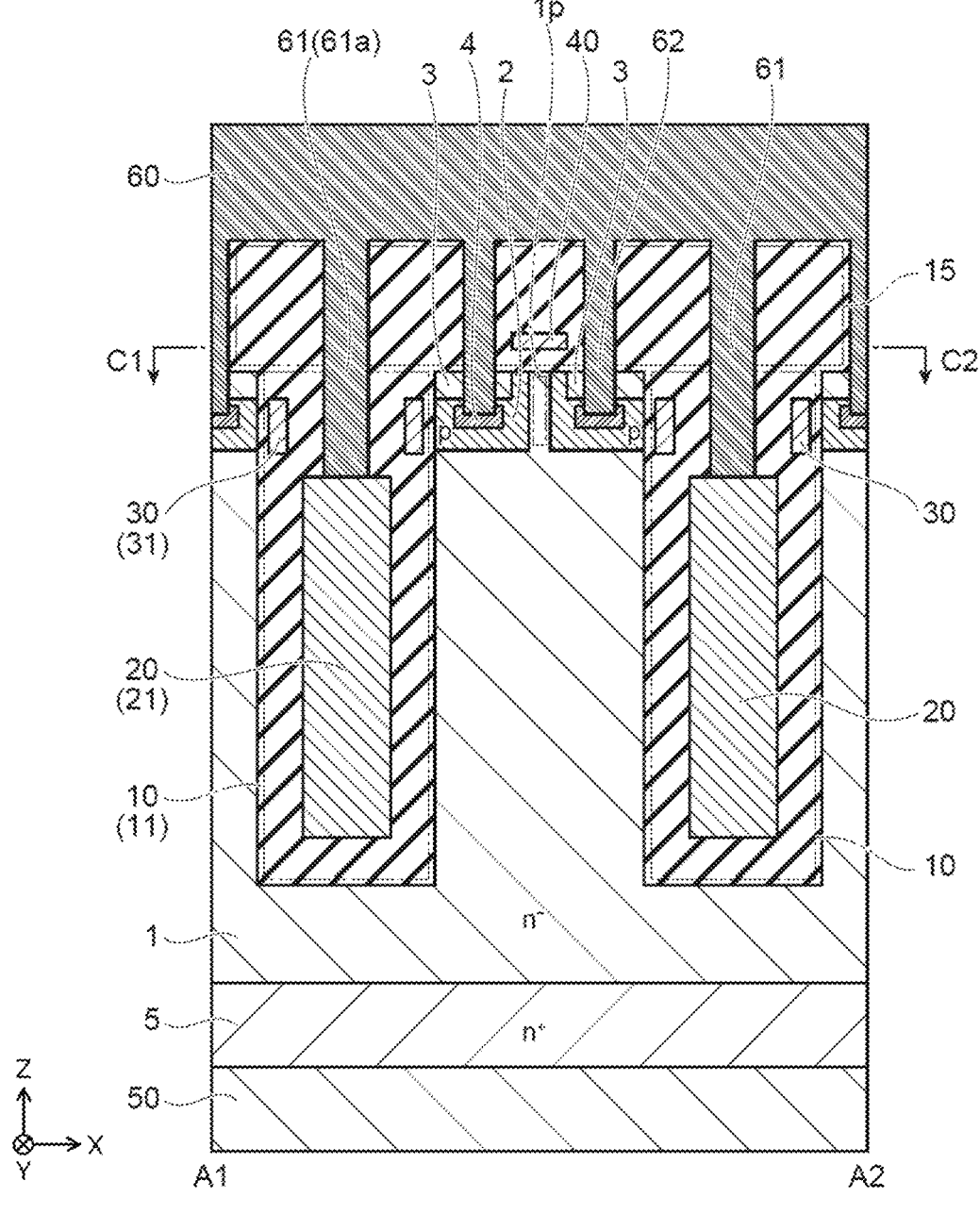
FIG. 18 is an A1-A2 cross-sectional view of FIG. 17.
Figure 19:
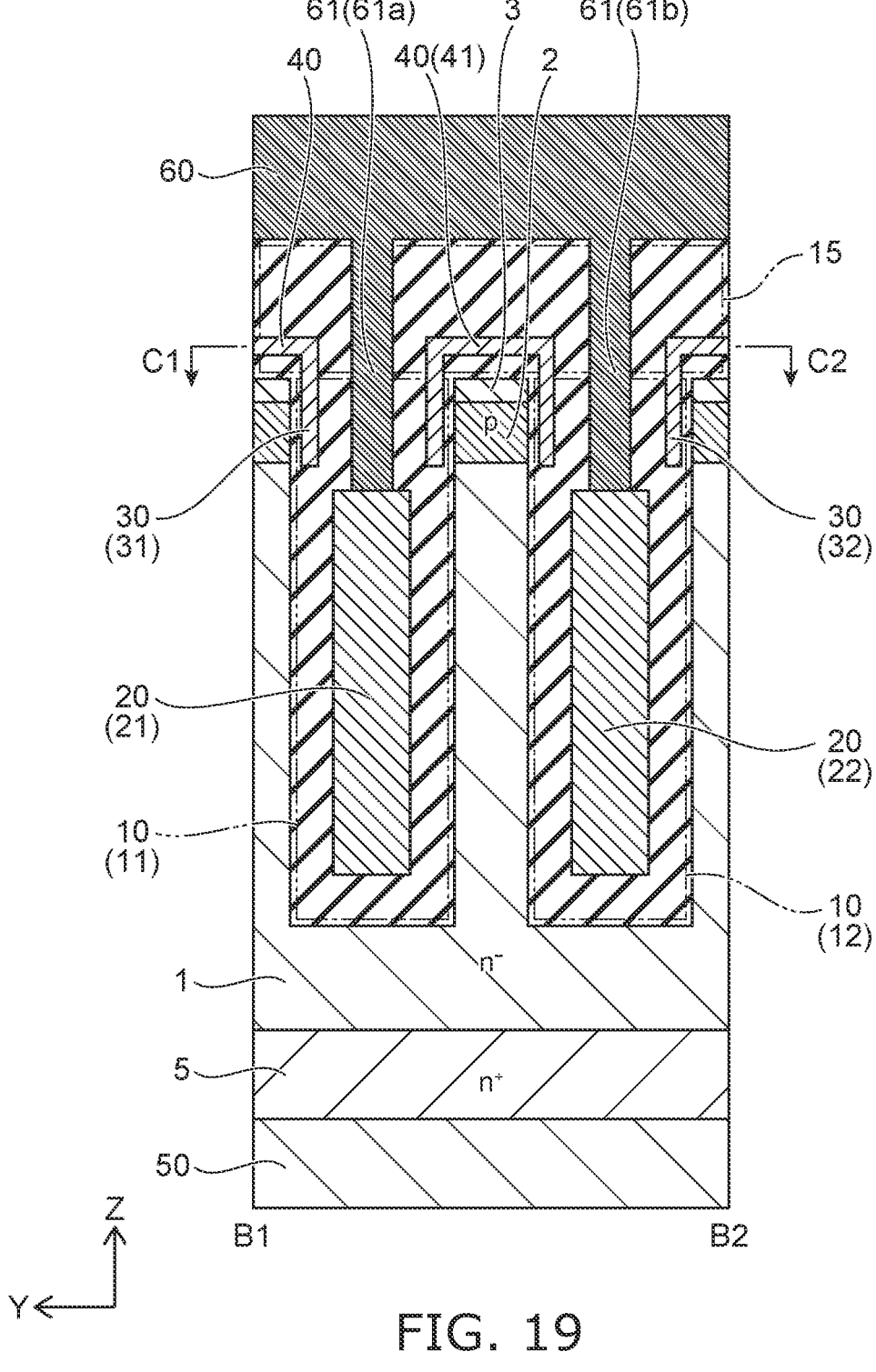
FIG. 19 is a B1-B2 cross-sectional view of FIG. 17.

FIG. 17 is a plan view showing a portion of a semiconductor device according to a second embodiment. FIG. 18 is an A1-A2 cross-sectional view of FIG. 17. FIG. 19 is a B1-B2 cross-sectional view of FIG. 17. FIG. 17 corresponds to C1-C2 cross-sectional views of FIGS. 18 and 19. The insulating part 15 is not illustrated in FIG. 17.

The semiconductor device 200 according to the second embodiment differs from the semiconductor devices 100 to 130 according to the first embodiment in that the semiconductor device 200 has a planar gate structure.

Specifically, as shown in FIG. 18, the n⁻-type drift region 1 includes a first portion 1p arranged with the n⁺-type source region 3 in a direction perpendicular to the Y-Z plane. The first portion 1p is positioned between the n⁺-type source regions 3. A portion of the p-type base region 2 is located between the first portion 1p and the n⁺-type source region 3. As shown in FIG. 18, the connection part 40 faces the first portion 1p, the portion of the p-type base region 2, and a portion of the n⁺-type source region 3 in the Z-direction via a portion of the insulating part 15. The portion of the insulating part 15 functions as a gate insulating layer.

As shown in FIGS. 17 and 19, the n⁺-type source region 3 is positioned under the two side portions of the connection part 40. The two side portions are end portions of the connection part 40 in a direction orthogonal to the extension direction of the connection part 40. In the semiconductor device according to the first embodiment, multiple n⁺-type source regions 3 are arranged in the Y-direction. In contrast, in the semiconductor device 200, the n⁺-type source regions 3 are linked to each other in the Y-direction.

When the semiconductor device 200 is in the on-state, a channel is formed not only in a portion of the p-type base region 2 facing the gate electrode 30 but also in another portion of the p-type base region 2 facing the connection part 40. The electrons can move between the n⁺-type source region 3 and the first portion 1p via the channel. According to the second embodiment, compared to the first embodiment, the current path in the on-state is increased. Therefore, according to the second embodiment, the on-resistance of the semiconductor device 200 can be further reduced.

The structures according to any of the modifications of the first embodiment also are applicable to the semiconductor device 200. For example, the semiconductor device 200 includes the insulating parts 11 to 13, the conductive parts 21 to 23, the gate electrodes 31 to 33, the connection part 41, and the extension portions 61a to 61c. The semiconductor device 200 may further include the connection part 42 similarly to the semiconductor device 110 or 120. The semiconductor device 200 may further include the connection part 43 similarly to the semiconductor device 130. The gate resistance of the semiconductor device 200 can be reduced thereby.

In the embodiments described above, the relative levels of the impurity concentrations between the semiconductor regions can be confirmed using, for example, a scanning capacitance microscope (SCM). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region can be measured by, for example, secondary ion mass spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
a first electrode;
a first semiconductor region located on the first electrode and electrically connected with the first electrode, the first semiconductor region being of a first conductivity type;
a second semiconductor region located on the first semiconductor region, the second semiconductor region being of a second conductivity type;
a third semiconductor region located on a portion of the second semiconductor region, the third semiconductor region being of the first conductivity type;
a first conductive part located in the first semiconductor region with a first insulating part interposed;
a first gate electrode located in the first insulating part, the first gate electrode facing the second semiconductor region in a second direction perpendicular to a first direction, the first direction being from the first electrode toward the first semiconductor region;
a second conductive part located in the first semiconductor region with a second insulating part interposed, the second conductive part being separated from the first conductive part in the second direction;
a second gate electrode located in the second insulating part, the second gate electrode facing the second semiconductor region in the second direction;
a first connection part located higher than the second and third semiconductor regions, the first connection part extending in the second direction and contacting the first and second gate electrodes; and
a second electrode located on the second and third semiconductor regions, the second electrode being electrically connected with the second semiconductor region, the third semiconductor region, the first conductive part, and the second conductive part,
wherein a width of the first connection part in a third direction, which is perpendicular to the first direction and the second direction, is shorter than a distance between the first conductive part and the second conductive part in the second direction.

2. The device according to claim 1, wherein
the second electrode includes a first extension portion extending in the first direction and contacting the first conductive part, and
the first gate electrode is located around a portion of the first extension portion along a first plane perpendicular to the first direction.

3. The device according to claim 2, wherein
the second electrode includes a second extension portion extending in the first direction and contacting the second conductive part, the second gate electrode is located around a portion of the second extension portion along the first plane, and
the first connection part is positioned between the first extension portion and the second extension portion.

4. The device according to claim 1, wherein
the first connection part faces a portion of the first semiconductor region, the second semiconductor region, and a portion of the third semiconductor region via a gate insulating layer in the first direction.

5. The device according to claim 1, further comprising:
a third conductive part located in the first semiconductor region with a third insulating part interposed, the third conductive part being separated from the first conductive part in a fourth direction, the fourth direction being perpendicular to the first direction and crossing the second direction; and
a third gate electrode located in the third insulating part.

6. The device according to claim 5, further comprising:
a second connection part located higher than the second and third semiconductor regions,
the second connection part extending in the fourth direction and contacting the first and third gate electrodes.

7. The device according to claim 6, wherein
the second connection part includes polysilicon.

8. The device according to claim 1, further comprising:
a conductive part located in the first semiconductor region with an insulating part interposed in the termination region, the conductive part being separated from the first and second conductive parts and electrically connected with the second electrode;
an electrode layer separated from the conductive part in the first direction and electrically connected with the first gate electrode, the second gate electrode, and the first connection part, the electrode layer including polysilicon; and
a gate wiring located on the electrode layer, and separated from the second electrode.

9. A semiconductor device, comprising:
a first electrode;
a first semiconductor region located on the first electrode and electrically connected with the first electrode, the first semiconductor region being of a first conductivity type;
a second semiconductor region located on the first semiconductor region, the second semiconductor region being of a second conductivity type;
a third semiconductor region located on a portion of the second semiconductor region, the third semiconductor region being of the first conductivity type;
a first conductive part located in the first semiconductor region with a first insulating part interposed;
a first gate electrode located in the first insulating part, the first gate electrode facing the second semiconductor region in a second direction perpendicular to a first direction, the first direction being from the first electrode toward the first semiconductor region;
a second conductive part located in the first semiconductor region with a second insulating part interposed, the second conductive part being separated from the first conductive part in the second direction;
a second gate electrode located in the second insulating part, the second gate electrode facing the second semiconductor region in the second direction;
a first connection part located higher than the second and third semiconductor regions, the first connection part including polysilicon and electrically connecting the first and second gate electrodes; and

a second electrode located on the second and third semiconductor regions and electrically connected with the second semiconductor region, the third semiconductor region, the first conductive part, and the second conductive part, wherein a width of the first connection part in a third direction, which is perpendicular to the first direction and the second direction, is shorter than a distance between the first conductive part and the second conductive part in the second direction.

10. The device according to claim 9, wherein the second electrode includes a first extension portion extending in the first direction and contacting the first conductive part, and the first gate electrode is located around a portion of the first extension portion along a first plane perpendicular to the first direction.

11. The device according to claim 10, wherein the second electrode includes a second extension portion extending in the first direction and contacting the second conductive part, the second gate electrode is located around a portion of the second extension portion along the first plane, and the first connection part is positioned between the first extension portion and the second extension portion.

12. The device according to claim 9, wherein the first connection part faces a portion of the first semiconductor region, the second semiconductor region, and a portion of the third semiconductor region via a gate insulating layer in the first direction.

13. The device according to claim 9, further comprising:

a third conductive part located in the first semiconductor region with a third insulating part interposed, the third conductive part being separated from the first conductive part in a fourth direction, the fourth direction being perpendicular to the first direction and crossing the second direction; and a third gate electrode located in the third insulating part.

14. The device according to claim 13, further comprising:

a second connection part located higher than the second and third semiconductor regions, the second connection part extending in the fourth direction and contacting the first and third gate electrodes.

15. The device according to claim 14, wherein the second connection part includes polysilicon.

16. The device according to claim 9, further comprising:

a conductive part located in the first semiconductor region with an insulating part interposed in the termination region, the conductive part being separated from the first and second conductive parts and electrically connected with the second electrode;

an electrode layer separated from the conductive part in the first direction and electrically connected with the first gate electrode, the second gate electrode, and the first connection part, the electrode layer including polysilicon; and a gate wiring located on the electrode layer, and separated from the second electrode.

* * * * *